(12) United States Patent
Lin et al.

(10) Patent No.: US 11,699,673 B2
(45) Date of Patent: *Jul. 11, 2023

(54) SEMICONDUCTOR PACKAGE HAVING VARYING CONDUCTIVE PAD SIZES

(71) Applicant: Taiwan Semiconductor Manufacturing Company, Ltd., Hsinchu (TW)

(72) Inventors: Chih-Hao Lin, Hsinchu (TW); Chien-Kuo Chang, Zhubei (TW); Tzu-Kai Lan, Yilan (TW); Chung-Chih Chen, Hsinchu (TW); Jr-Lin Hsu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 95 days.

This patent is subject to a terminal disclaimer.

(21) Appl. No.: 17/321,667

(22) Filed: May 17, 2021

(65) Prior Publication Data

US 2021/0272919 A1    Sep. 2, 2021

Related U.S. Application Data

(63) Continuation of application No. 16/908,388, filed on Jun. 22, 2020, now Pat. No. 11,011,487, which is a continuation of application No. 16/258,888, filed on Jan. 28, 2019, now Pat. No. 10,700,030.

(60) Provisional application No. 62/718,537, filed on Aug. 14, 2018.

(51) Int. Cl.
*H01L 23/00* (2006.01)
*H01L 23/31* (2006.01)

(52) U.S. Cl.
CPC .......... *H01L 24/09* (2013.01); *H01L 23/3171* (2013.01); *H01L 24/17* (2013.01); *H01L 2224/0401* (2013.01); *H01L 2924/3512* (2013.01)

(58) Field of Classification Search
CPC ............................. H01L 24/09; H01L 23/3171
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — Anthony Ho
(74) *Attorney, Agent, or Firm* — McClure, Qualey & Rodack, LLP

(57) ABSTRACT

A semiconductor package is provided, including a package component and a number of conductive features. The package component has a non-planar surface. The conductive features are formed on the non-planar surface of the package component. The conductive features include a first conductive feature and a second conductive feature respectively arranged in a first position and a second position of the non-planar surface. The height of the first position is less than the height of the second position, and the size of the first conductive feature is smaller than the size of the second conductive feature.

20 Claims, 11 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 10,700,030 B2 | 6/2020 | Lin et al. |
| 11,011,487 B2 * | 5/2021 | Lin ................... H01L 23/3171 |

* cited by examiner

US 11,699,673 B2

SEMICONDUCTOR PACKAGE HAVING VARYING CONDUCTIVE PAD SIZES

CROSS REFERENCE TO RELATED APPLICATIONS

This application is a Continuation of U.S. application Ser. No. 16/908,388, filed on Jun. 22, 2020, now U.S. Pat. No. 11,011,487, which is a Continuation application of U.S. patent application Ser. No. 16/258,888, filed on Jan. 28, 2019, now U.S. Pat. No. 10,700,030, which claims priority of U.S. Provisional Patent Application No. 62/718,537, filed on Aug. 14, 2018, the entirety of which is incorporated by reference herein.

BACKGROUND

Modern integrated circuits are formed on semiconductor chips. To increase manufacturing throughput and lower manufacturing cost, the integrated circuits are manufactured in semiconductor wafers, each containing many identical semiconductor chips. After the integrated circuits are made, semiconductor chips are sawed from the wafers and packaged before they can be used.

In a typical packaging process, semiconductor chips (also referred to as semiconductor dies) are first attached to package substrates. This includes physically securing the semiconductor chips on the package substrates, and connecting conductive pads on the semiconductor chips to conductive pads on the package substrates. Underfill material, which typically comprises epoxy, is used to secure the packages. The semiconductor chips may be bonded using either flip-chip bonding or wire bonding. The packages are then bonded to printed circuit boards (PCBs) through ball grid array (BGA) balls. Although existing packaging techniques have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
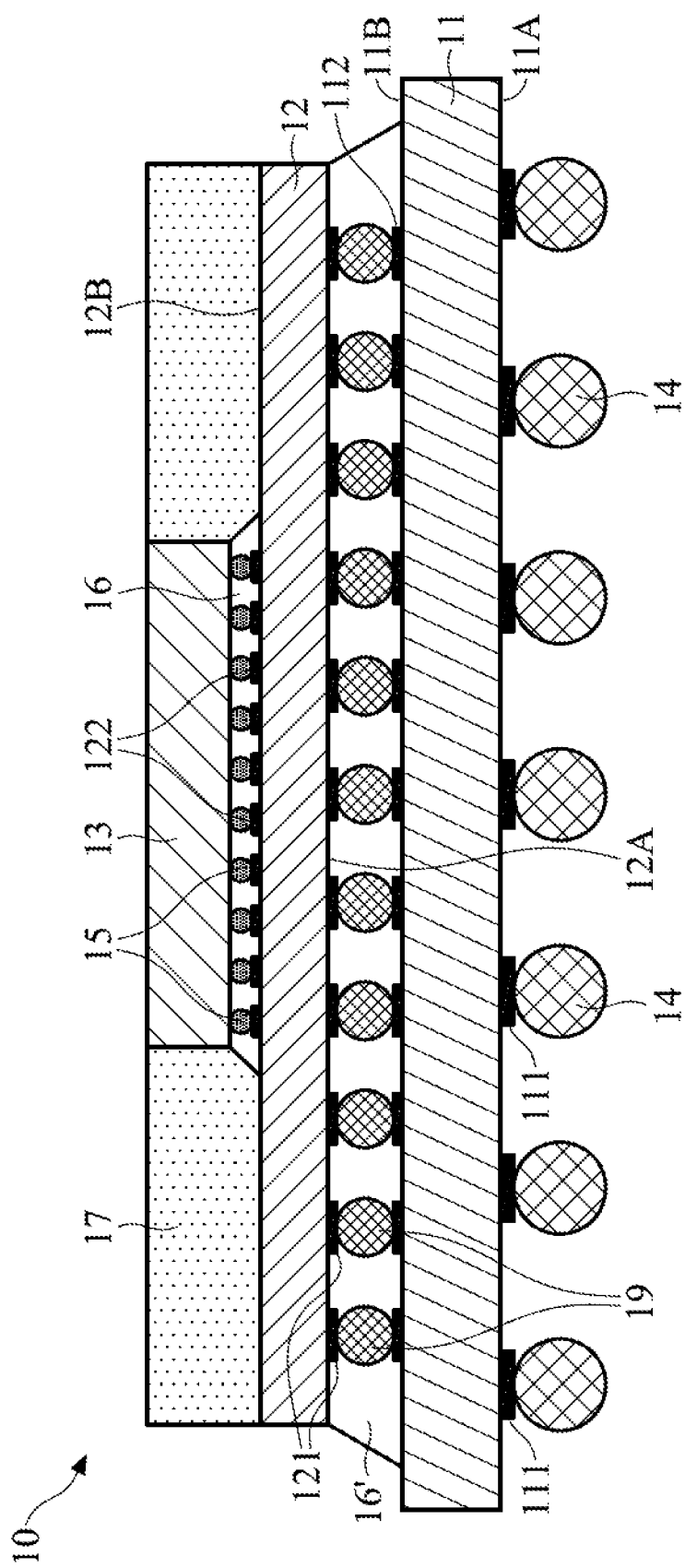
FIG. 1 is a cross-sectional view of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

The present disclosure relates generally to semiconductor packages and, more particularly, to three-dimensional (3D) semiconductor packages. In the following embodiments of semiconductor packages, the sizes of the conductive features (e.g., conductive pads) on the package components (e.g., semiconductor chips or interposers) and/or the package substrates are varied, thereby controllably adjusting the heights of the ball joints (i.e., solder balls) on the conductive features and compensating for non-planarity of the package components and/or the package substrate. As a result, the package-level yield and the board-level yield are improved. Some variations of the embodiments will be described. Throughout the various views and illustrative embodiments, like reference numbers are used to designate like elements.

Referring to FIG. 1, which is a cross-sectional view of a semiconductor package 10 in accordance with some embodiments. The semiconductor package 10 includes a package substrate 11, an interposer 12, and a semiconductor chip 13. It should be appreciated that some additional elements can be added into the semiconductor package 10 in different embodiments, and some of the elements described below can be replaced or eliminated in other embodiments of the semiconductor package 10.

As shown in FIG. 1, the semiconductor chip 13 is bonded to the interposer 12, and the interposer 12 is bonded to the package substrate 11. Although not shown, the package substrate 11 may be further bonded to an external device (e.g., a printed circuit board (PCB)) via a set of solder balls 14 (they can also be referred to as conductive connectors), to allow electrical connection between the semiconductor package 10 and the external device in some embodiments.

The package substrate 11 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive materials needed to receive and transmit electrical signals. In some embodiments, the package substrate 11 is a multiple-layer circuit board, in which conductive redistribution lines (not shown) are formed to electrically couple the conductive pads 111, 112 (they can also be referred as conductive features) on opposite surfaces 11A and 11B of the package substrate 11. Solder materials (e.g., Sn—Ag, Sn—Ag—Cu, lead-free materials, lead-containing materials, or the like) may be dispensed onto the conductive pads 111 on the bottom surface 11A of the package substrate 11, and then subjected to a reflow processing to form the solder balls 14 (this is also called a ball-mounting process), in the embodiments shown in FIG. 1. The solder balls 14 may have a diameter of about 0.2 mm to about 0.8 mm in some embodiments.

The semiconductor chip 13 is bonded to the top surface 12B of the interposer 12 by a flip-chip bonding, in the embodiments illustrated in FIG. 1. For example, the semiconductor chip 13 is a flip chip having an active surface (e.g., the bottom surface shown in FIG. 1) provided with a number of conductive pads (not shown). A set of solder balls 15 (they can also be referred to as microbumps) having a diameter of about 5 μm to about 50 μm may be formed on each of the respective conductive pads of the semiconductor chip 13 by the ball-mounting process described above. Then, the solder balls 15 may be bonded to each of the respective conductive pads 122 on the top surface 12B of the interposer 12 by, for example, eutectic bonding to electrically connect the semiconductor chip 13 and the interposer 12.

As shown in FIG. 1, an underfill material 16 may be applied to fill the space between the semiconductor chip 13 and the interposer 12 and surround the solder balls 15. The underfill material 16 may be configured to provide a stronger mechanical connection and a heat bridge between the semiconductor chip 13 and the interposer 12, to reduce cracking in the solder balls 15 caused by thermal expansion mismatches between the semiconductor chip 13 and the interposer 12, and to protect the ball joints from contaminants, thereby improving reliability of the fabricated semiconductor package 10. The underfill material 16 may comprise an insulating material such as an epoxy, a resin, a filler material, a stress release agent (SRA), an adhesion promoter, another material, or a combination thereof in some embodiments. Furthermore, a molding compound 17 is formed over the interposer 12 and molds the semiconductor chip 13 therein. The molding compound 17 may be configured to protect the semiconductor chip 13 and other underlying elements or materials from the environment and external contaminants. The molding compound 17 may comprise epoxy, epoxy with thermally conductive filler materials, plastic molding compound, or another suitable material in some embodiments.

In various embodiments, the semiconductor chip 13 may be any suitable integrated circuit chip for a particular application. For example, the semiconductor chip 13 may include various types of semiconductor components and functional features, such as dynamic random-access memory (DRAM), static random-access memory (SRAM), flash memory, other forms of integrated circuit memory, processing circuits, imaging components, active components, passive components, and/or other semiconductor features. In some embodiments, the semiconductor package 10 includes a number of semiconductor chips bonded to the interposer 12, which are the same or different types of semiconductor chips.

The interposer 12 is typically bonded to the package substrate 11 after the semiconductor chip 13 is mounted on the interposer 12. In the embodiments illustrated in FIG. 1, the interposer 12 is bonded to the package substrate 11 via a set of solder balls 19 (they can also be referred to as conductive connectors). The solder balls 19 may be formed on each of the respective conductive pads 121 (they can also be referred to as conductive features) on the bottom surface 12A of the interposer 12 using the ball-mounting process described above. Then, the solder balls 19 may be bonded to each of the respective conductive pads 112 on the top surface 11B of the package substrate 11 by, for example, eutectic bonding to electrically connect the interposer 12 and the package substrate 11. The solder balls 19 may have a diameter of about 100 μm to about 150 μm in some embodiments.

The interposer 12 is a silicon interposer in some embodiments. Conductive redistribution lines and/or through vias (not shown) may be formed in the interposer 12 to electrically couple the conductive pads 121, 122 on opposite surfaces 12A and 12B of the interposer 12, thereby enabling fan-out of the semiconductor chip 13. Furthermore, as shown in FIG. 1, an underfill material 16' (similar to the underfill material 16 described above) is applied to fill the space between the interposer 12 and the package substrate 11 and surround the solder balls 19, to improve the reliability of the fabricated semiconductor package 10.

It should be understood that, during the packaging processes, such as flip-chip bonding, underfill material dispensing and ball-mounting are performed at elevated temperatures. These thermal processes often result in warpage of the package components (e.g., the semiconductor chip 13 and the interposer 12) and/or the package substrate 11 in the semiconductor package 10, due in part to the different CTEs (coefficients of thermal expansion) of the different package materials such as the semiconductor chip 13, interposer 12, package substrate 11, and underfill materials 16 and 16'.

Figure 2:
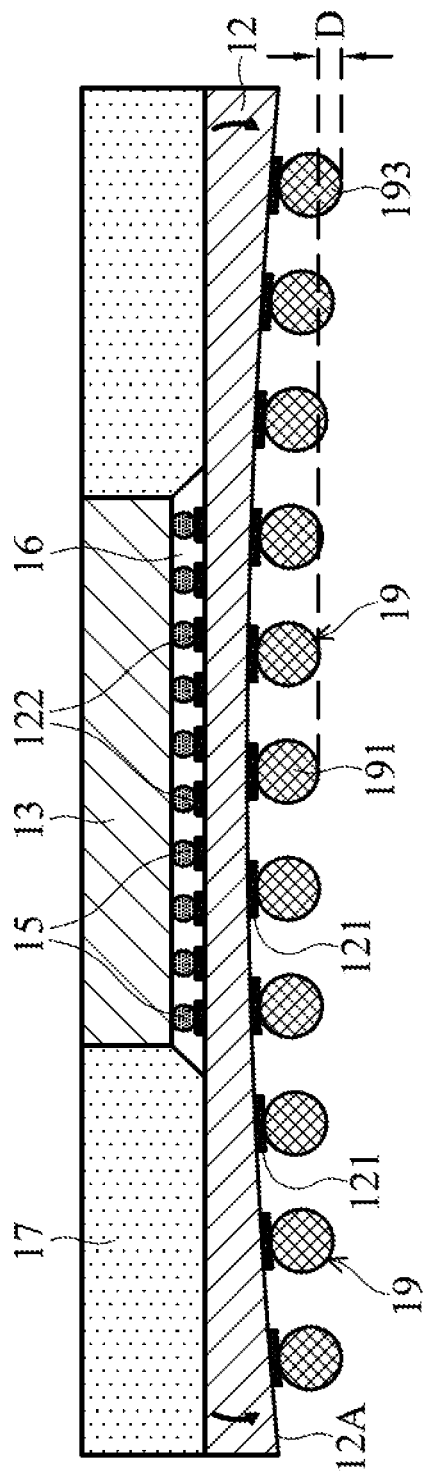
FIG. 2 schematically shows a case wherein the interposer exhibits warpage after being subjected to thermal processes.

For example, referring to FIG. 2 which schematically shows a case wherein the interposer 12 exhibits warpage after being subjected to thermal processes such as for mounting the semiconductor chip 13 and dispensing the underfill material 16 on the interposer 12. The warpage of the interposer 12 produces a non-planarity of the bonding surface (e.g., the bottom surface 12A) of the interposer 12, i.e., the surface upon which the solder balls 19 are formed. As shown in FIG. 2, the bonding surface 12A may be essentially concave because the interposer 12 warps toward the package substrate 11 (FIG. 1) at the edges. However, the bonding surface 12A may also be essentially convex because the interposer 12 warps toward the semiconductor chip 13 at the edges in other cases.

The solder balls 19 are typically formed on each of the respective conductive pads 121 and using the same amount of solder material. After the reflow process, the solder balls 19 are all of about the same size. As shown in FIG. 2, since each of the solder balls 19 has substantially the same height, it can be seen that, if the bonding surface 12A of interposer 12 is non-planar or warped, the respective upper points of the solder balls 19 are at different height. Distance D (indicated in FIG. 2) represents both the maximum height difference between the upper points and lower points of solder balls 19 (e.g., the height difference between the upper points of the center solder ball 191 and edge solder ball 193) and the degree of non-planarity of the bonding surface 12A (i.e., the distance between high and low points of the bonding surface 12A) of interposer 12. When the interposer 12 is bonded to the package substrate 11, and the Distance D exceeds a certain tolerance level, e.g., 100 μm (for an interposer 12 having a size of larger than about 25 mm×25 mm), the edge solder ball 193 may have a good contact with the package substrate 11, while the center solder ball 191 is likely to be out of contact with the package substrate 11 (in the case depicted in FIG. 2), thereby resulting in assembly yield degradation of the semiconductor package 10.

The following embodiments provide for measuring surface topology of the bonding surface of a package component (e.g., an interposer, or a semiconductor chip while it is directly attached to a package substrate in other embodiments) in a semiconductor package, and in particular they provide for measuring the relative elevation of locations on the bonding surface, i.e., the degree of non-planarity. Based on these measurements, the embodiments further provide for forming conductive pads of different sizes to produce corresponding solder balls of different heights to compensate for the non-planarity of the package component and to provide an array of solder balls with different heights but whose tops are essentially coplanar.

Figure 3:
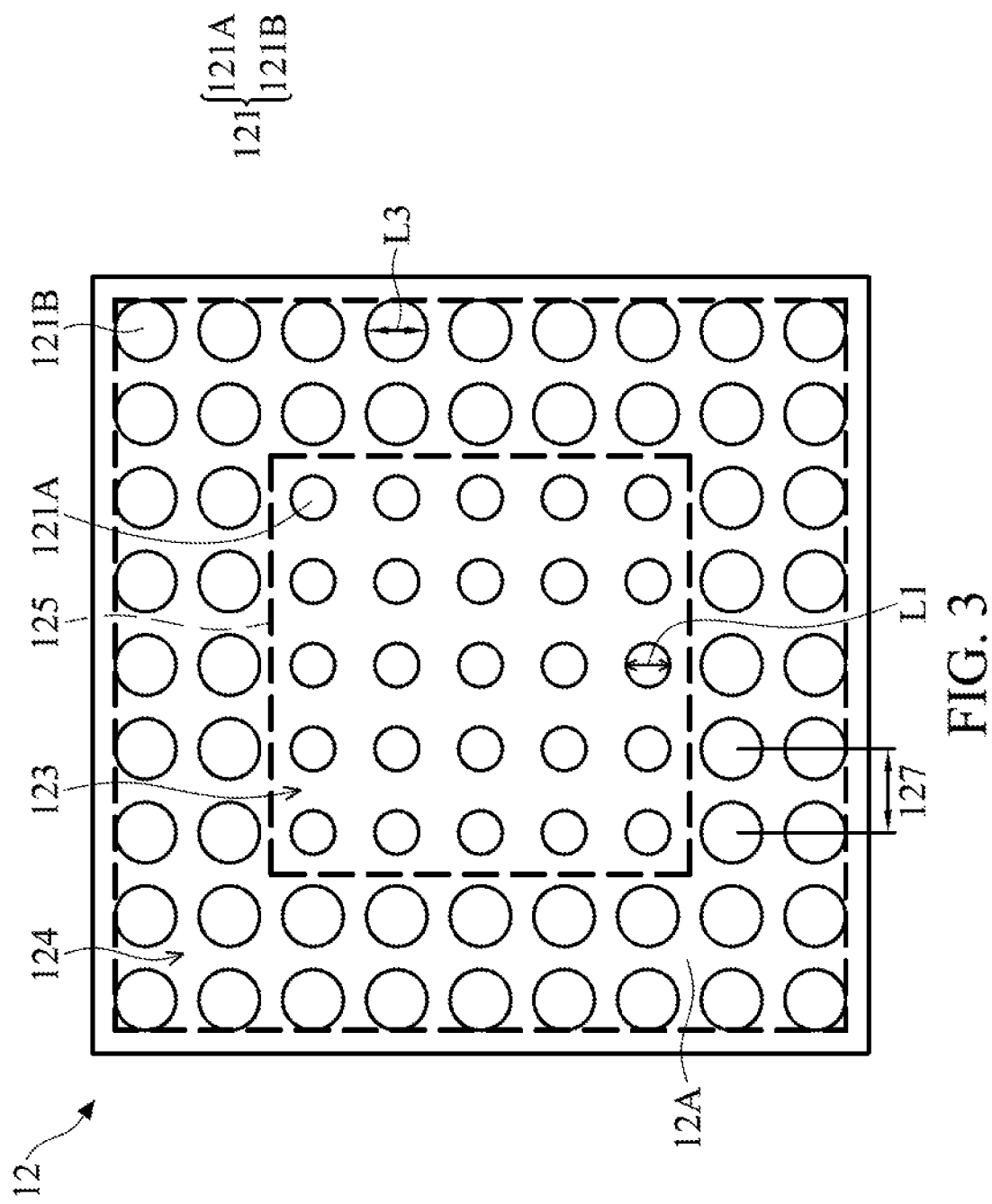
FIG. 3 is a bottom view of an interposer in accordance with some embodiments.

FIG. 3 schematically shows the conductive pads 121 formed in an array of orthogonal rows and columns on the bonding surface 12A of the interposer 12 in accordance with some embodiments. It should be appreciated that, after the semiconductor chip 13 are mounted on the interposer 12 and the underfill material 16 and molding compound 17 are formed over the interposer 12 (as shown in FIG. 2), but prior to the formation of the solder balls 19 on the conductive pads 121 of the interposer 12, various measuring techniques (e.g., optical measuring) may be used to measure the surface topography of the bonding surface 12A of the interposer 12 in some embodiments. Various tools for mapping or otherwise measuring the relative height of the bonding surface 12A are available and can be used to determine the elevation at the various locations of the bonding surface 12A including the degree of planarity of the bonding surface 12A. In some embodiments, the warpage of the interposer 12 may produce a non-planar surface whereby the bonding surface 12A is essentially concave (for example, see FIG. 2), and in other some embodiments, the bonding surface 12A may be essentially convex.

The conductive pads 121 are then formed based on the surface topology data generated. In particular, at locations of relatively low elevation of the bonding surface 12A, the conductive pads 121 are formed to have a relatively small size (i.e., area) or diameter, and at locations of relatively high elevation of the bonding surface 12A, the conductive pads 121 are formed to have a relatively large size or diameter.

Figure 4:
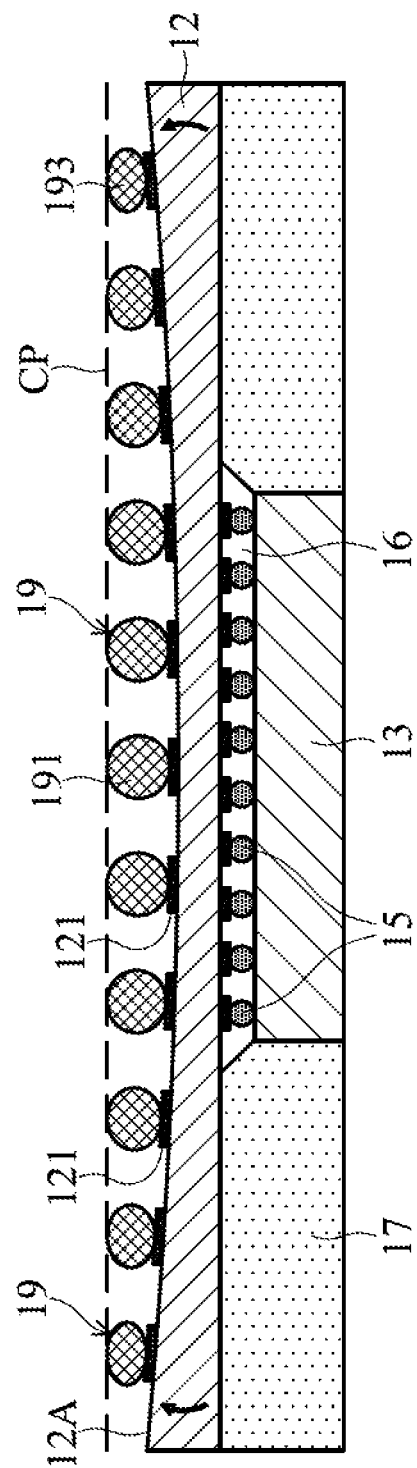
FIG. 4 is a cross-sectional view illustrating that the solder balls with different heights are formed on the bonding surface of the warped interposer in accordance with some embodiments.

In the embodiments illustrated in FIGS. 3 and 4, the bonding surface 12A of the interposer 12 is concave, i.e., the interposer 12 warps toward the package substrate 11 (FIG. 1) at the edges thereof (that is, the height at the edges of the bonding surface 12A is greater than the height at the central region of the bonding surface 12A). According to the illustrated exemplary embodiment, two distinct regions of different elevations and different conductive pad 121 sizes are provided based on the surface topographical measurements. FIG. 3 shows a peripheral region 124 having a higher elevation than the central region 123, and a boundary 125 separating the central region 123 from the peripheral region 124. Accordingly, conductive pads 121A formed (in an array) within the central region 123 are of smaller size (i.e. area) than the conductive pads 121B formed (in an array) within the peripheral region 124. Each of the conductive pads 121A and 121B is essentially circular in the embodiments illustrated in FIG. 3. Moreover, the conductive pads 121A formed within the central region 123 each have a diameter L1, and the conductive pads 121B formed within the peripheral region 124 each have a diameter L3 that is greater than the diameter L1 (diameters L1 and L3 are in a direction substantially parallel to the bonding surface 12A). The diameter L3 may be 10 to 50 percent greater than the diameter L1, but other size differences (for example. the diameter L3 may be 5 to 10 percent greater than the diameter L1) may also be used in other embodiments, depending upon the difference in the elevation of the various regions of the bonding surface 12A and further depending upon the amount of solder material used.

It should be understood that the embodiments illustrated in FIG. 3 is exemplary only. In other embodiments, more than two different regions, i.e., the central region 123 and peripheral region 124, of the bonding surface 12A may be used. There may be a peripheral region 124, a central region 123, and an intermediate region 126 therebetween, in some embodiments illustrated in FIG. 5. Conductive pads 121C formed (in an array) within the intermediate region 126 each have a diameter L2 (in a direction substantially parallel to the bonding surface 12A) that is greater than the diameter L1 of the conductive pads 121A formed within the central region 123 but smaller than the diameter L3 of the conductive pads 121B formed within the peripheral region 124. In other words, the sizes (i.e., areas) of conductive pads 121 from the central region to the peripheral region of the bonding surface 12A gradually increase (that is, the conductive pads 121A close to the center of the interposer 12 are of smaller size than the conductive pads 121B close to the edge of the interposer 12). However, the sizes of conductive pads 121 throughout the bonding surface 12A may have other variations due to the contours mapped by the measuring tool. For example, the sizes (or diameters) of the conductive pads 121A formed within the central region 123 may be greater than the sizes (or diameters) of the conductive pads 121B formed within the peripheral region 124 in cases where the central region 123 has a higher elevation than the peripheral region 124 (i.e., the bonding surface 12A of the interposer 12 is convex).

The size of the interposer 12 and the size of the bonding surface 12A may vary in various embodiments. Similarly, the sizes of the conductive pads 121 and pitch 127 between adjacent conductive pads 121 may also vary in various embodiments. Pitch 127 may vary from about 100 μm to about 120 μm in some exemplary embodiments, but other suitable pitches may also be used in other exemplary embodiments. According to some exemplary embodiments in which the pitch 127 is about 120 μm, at least one of the diameters L1 and L3 may be about 120 μm to about 180 μm, but various other pitches and diameters may be used in other embodiments as long as adjacent solder balls 19 formed on the conductive pads 121 do not contact each other.

Figure 5:
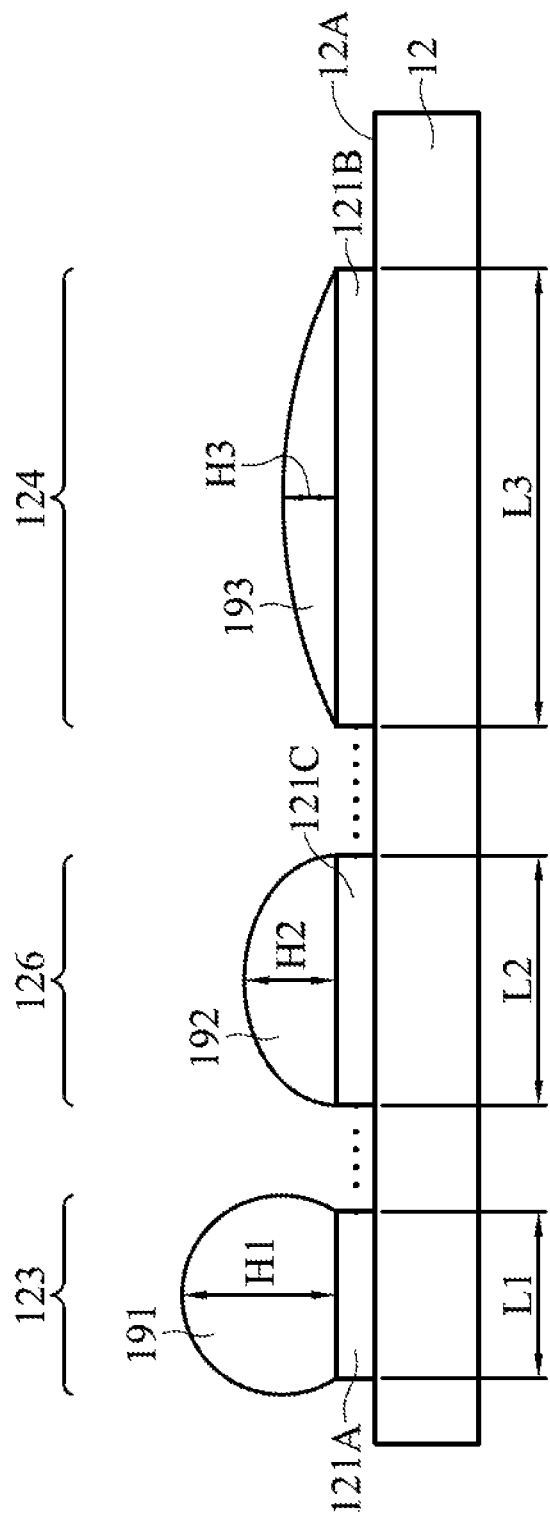
FIG. 5 schematically shows that the conductive pads on the bonding surface of interposer have at least three different diameters in accordance with some embodiments.

It has been found that when the same amount of solder material is used on conductive pads 121 having different sizes or diameters, the formed solder balls 19 have different heights after the reflow process. For example, solder balls 19 formed on the conductive pads 121 having greater sizes or diameters may have a lower height (in a direction substantially perpendicular to the bonding surface 12A) than the solder balls 19 formed on the conductive pads 121 having smaller sizes or diameters. As shown in FIG. 5, as the diameters of the conductive pads 121B, 121C, 121A are L3>L2>L1, the heights of the solder balls 193, 192, 191 formed on the corresponding conductive pads 121B, 121C, 121A are H3<H2<H1. Applicants attribute this difference to surface tension phenomenon, as the solder material does not laterally encroach the initial peripheral boundaries of the conductive pads 121. Solder balls 19 may be spherical or ovoid in shape depending on the amount of solder material used and the size of the conductive pad 121 upon which the solder ball 19 is formed. The heights of the solder balls 19 may vary depending on the sizes of the conductive pads 121.

Accordingly, the solder balls 19 that have different heights because of the surface topographical measurements compensate for the non-planarity of the interposer 12 so that the distance D (FIG. 2) between the upper points and lower points of the solder balls 19 (for example, the top points of the center solder ball 191 and the edge solder ball 193) is as small as possible. In some embodiments, the distance D is at least less than the maximum non-planarity (e.g., 100 µm) allowed for mounting the interposer 12 to the package substrate 11 (hereinafter referred to as specified allowable non-planarity). For example, the distance D may be less than about ⅓ of the specified allowable non-planarity, or further less than about ⅕ of the specified allowable non-planarity. As a result, the tops of the solder balls 19 are essentially coplanar (as indicated by the line CP shown in FIG. 4), thereby improving assembly yield of the semiconductor package 10 (i.e., the package components and the package substrate in the semiconductor package 10 can be well jointed).

Figure 6A:
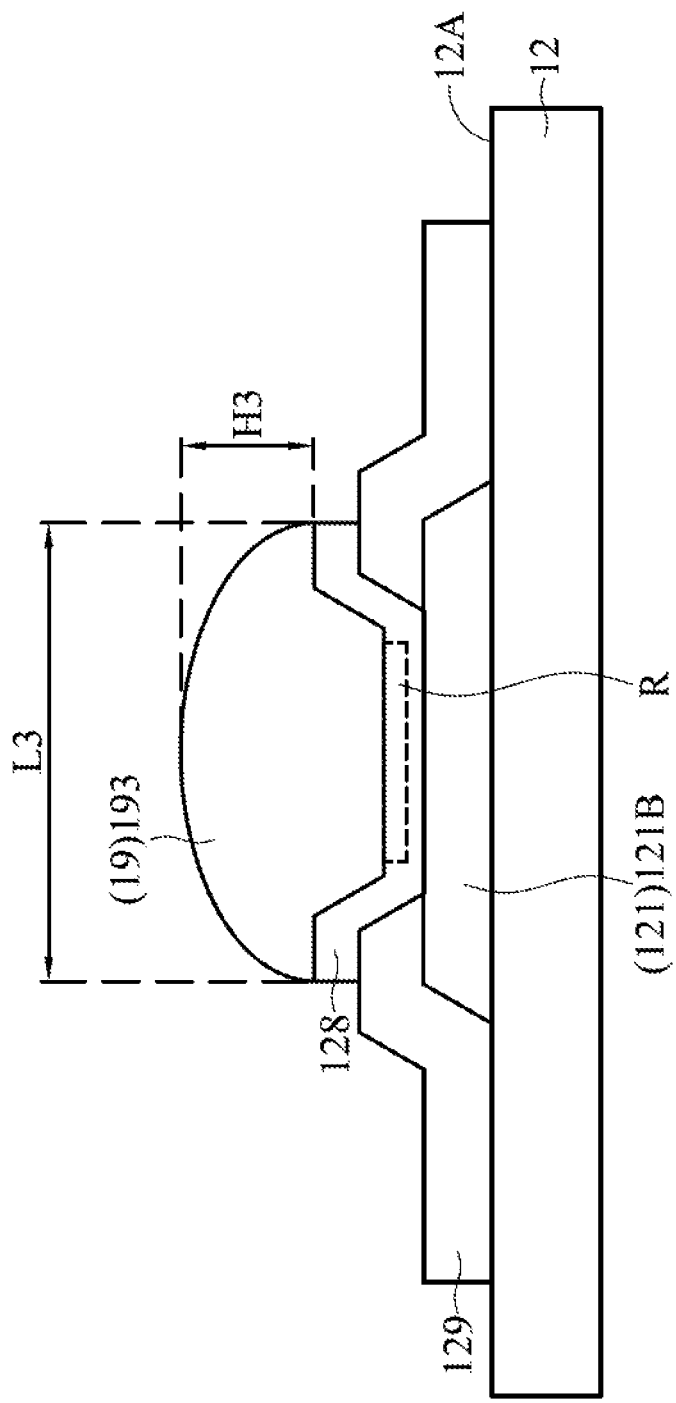
FIG. 6A schematically shows an under ball metallization (UBM) layer formed between one conductive pad of the interposer and the corresponding solder ball and a recess formed on the UBM layer in accordance with some embodiments.
Figure 6B:
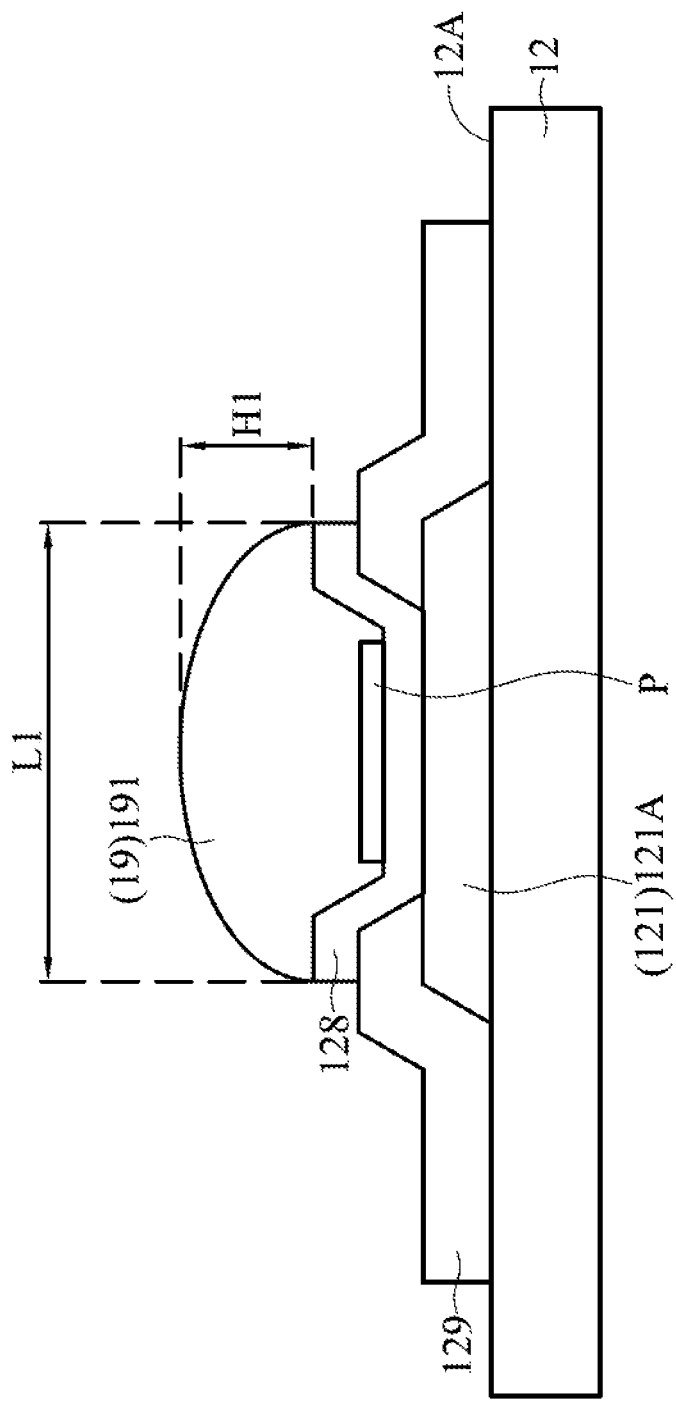
FIG. 6B schematically shows an under ball metallization (UBM) layer formed between one conductive pad of the interposer and the corresponding solder ball and a protrusion formed on the UBM layer in accordance with some embodiments.

Referring to FIGS. 6A and 6B, which schematically show an under ball metallization (UBM) layer 128 formed between each of the conductive pads 121 on the bonding surface 12A of the interposer and the corresponding solder ball 19 in accordance with some embodiments. In the embodiments illustrated in FIGS. 6A and 6B, the interposer 12 further has a passivation layer 129 covering each of the conductive pads 121 on the bonding surface 12A, and the passivation layer 129 forms an opening to expose the underlying corresponding conductive pad 121. An UBM layer 128 is further formed to cover a part of the top surface of the passivation layer 129, fill the opening, and contact the conductive pad 121 in the opening. Although not shown, the UBM layer 128 may comprise multiple layers of different metal materials, such as an adhesion layer, a diffusion barrier layer, as well as solder layer(s). The metal materials may comprise Cu, Ti, Ni, Au, Al, or other suitable metal materials depending on the type of material used for the solder balls 19 and the process for forming the UBM layer 128. The UBM layer 128 may be formed by a physical vapor deposition (PVD) process or a sputtering process in some embodiments. The UBM layer 128 may have a thickness of about 20 µm to about 40 µm in some embodiments.

It should also be appreciated that when the sizes (i.e., areas) of the UBM layers 128 on each of the respective conductive pads 121 vary, the heights of the solder balls 19 formed on the respective UBM layers 128 may also vary accordingly. For example, when the size (or diameter) of one UBM layer 128 is increased, the height of the formed solder ball 19 may be reduced, and vice versa (similar to the relation between the sizes or diameters of the conductive pads 121 and the heights of the solder balls 19 described above). As shown in FIGS. 6A and 6B, the diameter of the UBM layer 128 is determined by the horizontal distance between the outermost opposite edges of the UBM layer 128 over the passivation layer 129, and the height of the solder ball 19 is determined by the vertical distance between the top point of the solder ball 19 and the top surface of the UBM layer 128 over the passivation layer 129. The size or diameter of the UBM layer 128 may be similar to those of the underlying conductive pad 121 in some embodiments.

Accordingly, the solder balls 19 having different heights, due to the different sizes of the UBM layers 128, compensate for the non-planarity of the interposer 12 so that the distance D (FIG. 2) between the upper points and lower points of solder balls 19 (for example, the top points of the center solder ball 191 and the edge solder ball 193) is as small as possible. As a result, the tops of the solder balls 19 are essentially coplanar (as indicated by the line CP shown in FIG. 4), thereby improving assembly yield of the semiconductor package 10.

Furthermore, as shown in FIGS. 6A and 6B, a recess R or a protrusion P may be further formed on the UBM layer 128 to adjust the height of the solder ball 19. For example, as shown in FIG. 6A, in addition to enlarging the size or the diameter L3 of the UBM layer 128, a recess R may be further formed on the UBM layer 128, to reduce the height (e.g., the height H3) of the solder ball 19 (e.g., the edge solder ball 193 shown in FIG. 4) exposed over the UBM layer 128. As shown in FIG. 6B, in addition to reducing the size or the diameter L1 of the UBM layer 128, a protrusion P may be further formed on the UBM layer 128, to increase the height (e.g., the height H1) of the solder ball 19 (e.g., the center solder ball 191 shown in FIG. 4). It should be understood that the embodiments illustrated in FIGS. 6A and 6B is exemplary only, and the recess R or protrusion P may be formed on any of the UBM layer 128 at various locations of the bonding surface 12A to adjust the heights of solder balls 19 thereon, thereby compensating for the non-planarity of the interposer 12. In some embodiments, the recess R or the protrusion P is integrally formed with the UBM 128. The recess R and the protrusion P may have a thickness or height of about 5 µm to about 10 µm, but other suitable thickness may also be used in other some embodiments.

Figure 7:
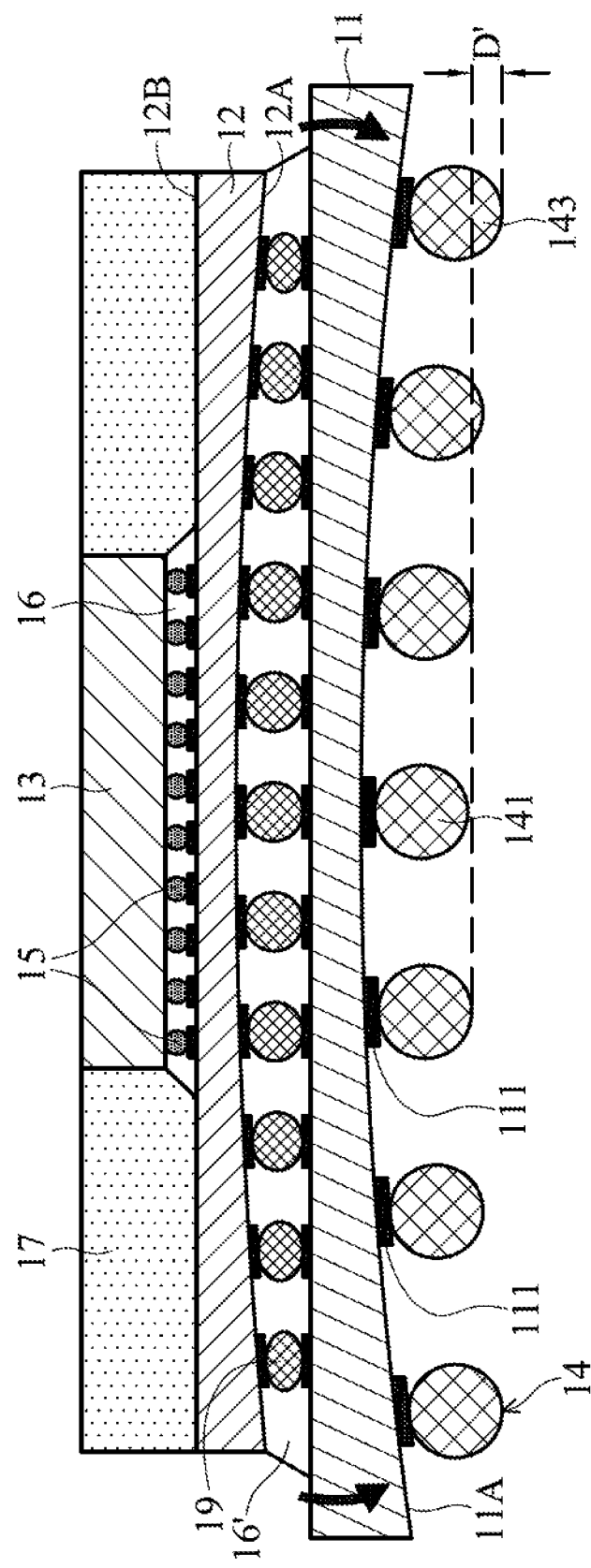
FIG. 7 schematically shows a case wherein the package substrate exhibits warpage after being subjected to thermal processes.

Referring to FIG. 7, which schematically shows a case wherein the package substrate 11 exhibits warpage after being subjected to thermal processes such as for mounting the interposer 12 and dispensing the underfill material 16' on the package substrate 11. The warpage of the package substrate 11 produces a non-planarity of the bonding surface (e.g., the bottom surface 11A) of the package substrate 11, i.e., the surface upon which the solder balls 14 are formed. As shown in FIG. 7, the bonding surface 11A may be essentially concave because the package substrate 11 warps toward the external device (e.g., a PCB, not shown) at the edges. However, the bonding surface 11A may also be essentially convex because the package substrate 11 warps toward the interposer 12 or semiconductor chip 13 at the edges in other cases. The warpage direction of the package substrate 11 is typically the same as the warpage direction of the package component (e.g., the interposer 12, or the semiconductor chip 13 while it is directly attached to the package substrate 11 in other embodiments). For example, both the bonding surface 12A of the interposer 12 and the bonding surface 11A of the package substrate 11 may be concave, as shown in FIG. 7.

The solder balls 14 are typically formed on each of the respective conductive pads 111 and using the same amount of solder material. After the reflow process, the solder balls 14 are all of about the same size. As shown in FIG. 7, since each of the solder balls 14 has substantially the same height, it can be seen that, if the bonding surface 11A of package substrate is non-planar or warped, the respective upper points of the solder balls 14 are at different height. Distance D' (indicated in FIG. 7) represents both the maximum height difference between the upper points and lower points of solder balls 14 (e.g., the height difference between the upper points of the center solder ball 141 and edge solder ball 143) and the degree of non-planarity of the bonding surface 11A (i.e., the distance between high and low points of the bonding surface 11A) of package substrate 11. The degree of non-planarity of the bonding surface 11A of package substrate 11 may be the same or different from that of the bonding surface 12A of interposer 12. When the package substrate 11 is bonded to the external PCB (not shown), and the Distance D' exceeds a certain tolerance level, e.g., 8 mil, the edge solder ball 143 may have a good contact with the external PCB, while the center solder ball 141 is likely to be out of contact with the external PCB (in the case depicted in FIG. 7), thereby resulting in degradation of the assembly yield for assembly the semiconductor package 10 with the external PCB (also called the board-level assembly).

To address this problem, the bonding surface 11A of the package substrate 11 may have a design similar to the bonding surface 12A of the interposer 12 described above. For example, after the interposer 12 are mounted on the package substrate 11 and the underfill material 16' is formed between the interposer 12 and the package substrate 11, but prior to the formation of the solder balls 14 on the conductive pads 111 on the bonding surface 11A of the package substrate 11, various measuring techniques (e.g., optical measuring) may be used to measure the surface topography of the bonding surface 11A of the package substrate 11 in some embodiments. Various tools for mapping or otherwise measuring the relative height of the bonding surface 11A are available and can be used to determine the elevation at the various locations of the bonding surface 11A including the degree of planarity of the bonding surface 11A. In some embodiments, the warpage of the package substrate 11 may produce a non-planar surface whereby the bonding surface 11A is essentially concave (for example, see FIG. 7), and in other some embodiments, the bonding surface 11A may be essentially convex.

The conductive pads 111 are then formed based on the surface topology data generated. In particular, at locations of relatively low elevation of the bonding surface 11A, the conductive pads 111 are formed to have a relatively small size (i.e., area) or diameter, and at locations of relatively high elevation of the bonding surface 11A, the conductive pads 111 are formed to have a relatively large size or diameter.

Figure 8:
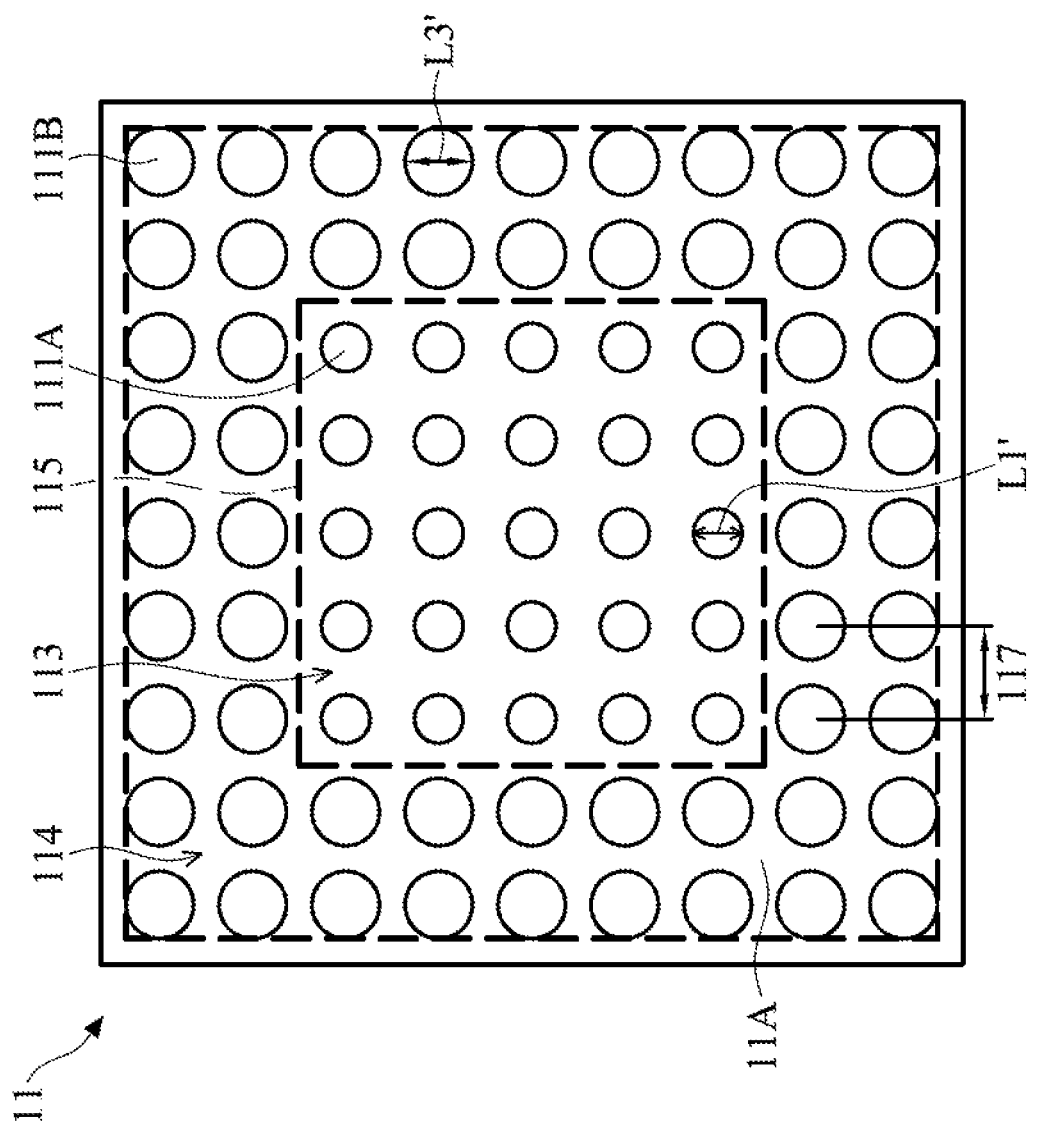
FIG. 8 is a bottom view of a package substrate in accordance with some embodiments.
Figure 9:
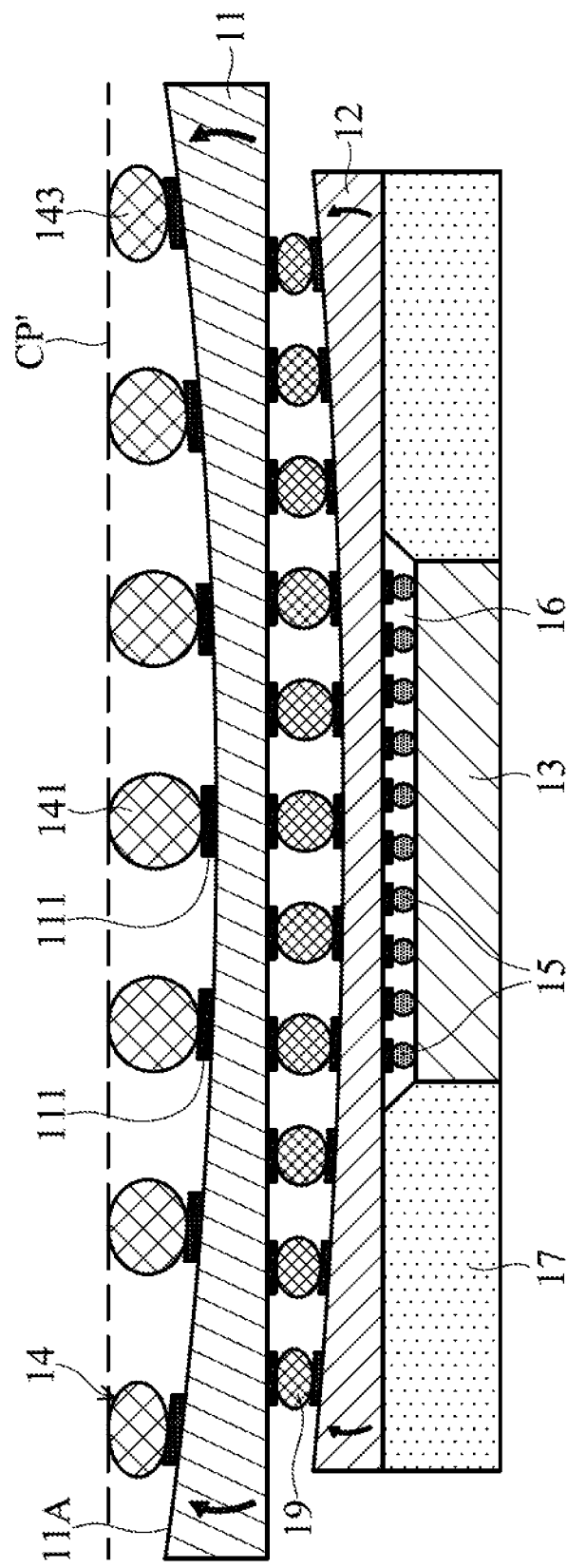
FIG. 9 is a cross-sectional view illustrating that the solder balls with different heights are formed on the bonding surface of the warped package substrate in accordance with some embodiments.

In the embodiments illustrated in FIGS. 8 and 9, the bonding surface 11A of the package substrate 11 is concave, i.e., the package substrate 11 warps toward the external PCB (not shown) at the edges thereof (that is, the height at the edges of the bonding surface 11A is greater than the height at the central region of the bonding surface 11A). According to the illustrated exemplary embodiment, two distinct regions of different elevations and different conductive pad 111 sizes are provided based on the surface topographical measurements. FIG. 8 shows a peripheral region 114 having a higher elevation than the central region 113, and a boundary 115 separating the central region 113 from the peripheral region 114. Accordingly, conductive pads 111A formed (in an array) within the central region 113 are of smaller size (i.e., area) than the conductive pads 111B formed (in an array) within the peripheral region 114. Each of the conductive pads 111A and 111B is essentially circular in the embodiments illustrated in FIG. 8. Moreover, the conductive pads 111A formed within the central region 113 each have a diameter L1', and the conductive pads 111B formed within the peripheral region 114 each have a diameter L3' that is greater than the diameter L1' (diameters L1' and L3' are in a direction substantially parallel to the bonding surface 11A). The diameter L3' may be 10 to 30 percent greater than the diameter L1', but other size differences (for example. the diameter L3' may be 5 to 10 percent greater than the diameter L1') may also be used in other embodiments, depending upon the difference in the elevation of the various regions of the bonding surface 11A and further depending upon the amount of solder material used.

Figure 10:
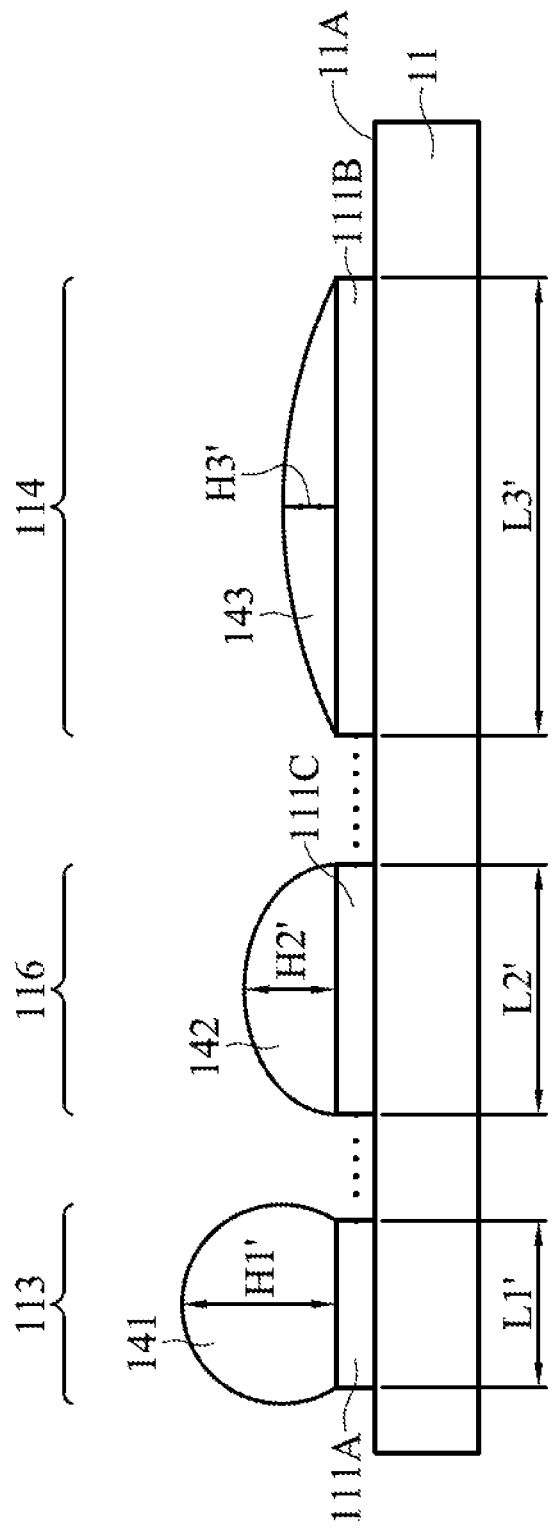
FIG. 10 schematically shows that the conductive pads on the bonding surface of package substrate have at least three different diameters in accordance with some embodiments.

It should be understood that the embodiments illustrated in FIG. 8 is exemplary only. In other embodiments, more than two different regions, i.e., the central region 113 and peripheral region 114, of the bonding surface 11A may be used. There may be a peripheral region 114, a central region 113, and an intermediate region 116 therebetween, in some embodiments illustrated in FIG. 10. Conductive pads 111C formed (in an array) within the intermediate region 116 each have a diameter L2' (in a direction substantially parallel to the bonding surface 12A) that is greater than the diameter L1' of the conductive pads 111A formed within the central region 113 but smaller than the diameter L3' of the conductive pads 111B formed within the peripheral region 114. In other words, the sizes (i.e. areas) of conductive pads 111 from the central region to the peripheral region of the bonding surface 11A gradually increase. However, the sizes (or diameters) of conductive pads 111 throughout the bonding surface 11A may have other variations due to the contours mapped by the measuring tool. For example, the sizes (or diameters) of the conductive pads 111A formed within the central region 113 may be greater than the sizes (or diameters) of the conductive pads 111B formed within the peripheral region 114 in cases where the central region 113 has a higher elevation than the peripheral region 114 (i.e., the bonding surface 11A of the package substrate 11 is convex).

The size of the package substrate 11 and the size of the bonding surface 11A may vary in various embodiments. Similarly, the sizes of the conductive pads 111 and pitch 117 between adjacent conductive pads 111 may also vary in various embodiments. Pitch 117 may vary from about 0.4 mm to about 1.0 mm in some exemplary embodiments, but other suitable pitches may also be used in other exemplary embodiments. According to some exemplary embodiments in which the pitch 117 is about 0.4 mm, at least one of the diameters L1' and L3' may be about 0.6 mm to about 0.8 mm, but various other pitches and diameters may be used in other embodiments as long as adjacent solder balls 14 formed on the conductive pads 111 do not contact each other.

It has been found that when the same amount of solder material is used on the conductive pads 111 having different sizes or diameters, the formed solder balls 14 have different heights after the reflow process. For example, the solder balls 14 formed on the conductive pads 111 having greater sizes or diameters may have a lower height (in a direction substantially perpendicular to the bonding surface 11A) than the solder balls 14 formed on the conductive pads 111 having smaller sizes or diameters. In the embodiments shown in FIG. 10, as the diameters of the conductive pads 111B, 111C, 111A are L3'>L2'>L1', the heights of the solder balls 143, 142, 141 formed on the corresponding conductive pads 111B, 111C, 111A are H3'<H2'<H1'. Applicants attribute this difference to surface tension phenomenon, as the solder material does not laterally encroach the initial peripheral boundaries of the conductive pads 111. Solder balls 14 may be spherical or ovoid in shape depending on the amount of solder material used and the size of the conductive pad 111 upon which the solder ball 14 is formed. The heights of the solder balls 14 may vary depending on the sizes of the conductive pads 111.

Accordingly, the solder balls 14 having different heights due to the surface topographical measurements compensate for the non-planarity of the package substrate 11 so that the distance D' (FIG. 7) between the upper points and lower points of solder balls 14 (for example, the top points of the center solder ball 141 and the edge solder ball 143) is as small as possible. In some embodiments, the distance D' is at least less than the maximum non-planarity (e.g., 8 mil) allowed for mounting the package substrate 11 to the external PCB (hereinafter referred to as specified allowable non-planarity). For example, the distance D' may be less than about ⅓ of the specified allowable non-planarity, or further less than about ⅕ of the specified allowable non-planarity. As a result, the tops of the solder balls 14 are essentially coplanar (as indicated by the line CP' shown in FIG. 9), thereby improving the board-level assembly yield (i.e., the semiconductor package 10 can be well jointed to the external PCB).

The embodiments of the present disclosure have some advantageous features: by providing the conductive pads or features with different sizes on the package components (e.g., semiconductor chips or interposers) and/or the package substrates, the heights of the ball joints (i.e., solder balls) on the conductive features are controllably changed so that the tops of the conductive features are essentially coplanar. Accordingly, the non-planarity of the package components and/or the package substrates is compensated without using extra force or stress to correct the warped package components or warped package substrates that may increase the risk of interfacial delamination. As a result, the package-level yield and the board-level yield are improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, a semiconductor package is provided. The semiconductor package includes a package component and a number of conductive features. The package component has a non-planar surface. The conductive features are formed on the non-planar surface of the package component. The conductive features include a first conductive feature and a second conductive feature respectively arranged in a first position and a second position of the non-planar surface. The height of the first position is less than the height of the second position, and the size of the first conductive feature is smaller than the size of the second conductive feature.

In some embodiments, a semiconductor package is provided. The semiconductor package includes a package component, a number of conductive features, and a number of conductive connectors. The package component has a non-planar surface. The conductive features are formed on the non-planar surface of the package component, and are arranged in different positions of the non-planar surface with different heights. The conductive connectors are formed on the conductive features, and have different heights. Taller conductive connectors are formed on the conductive features arranged in lower positions of the non-coplanar surface, and shorter conductive connectors are formed on the conductive features arranged in higher positions of the non-coplanar surface.

In some embodiments, a semiconductor package is provided. The semiconductor package includes a package component and a number of conductive features. The package component has a non-planar surface having a first region and a second region with different heights. The conductive features are formed on the non-planar surface of the package component. The conductive features have different areas. Larger-sized conductive features are arranged in the first region of the non-planar surface having a greater height, and smaller-sized conductive features are arranged in the second region of the non-planar surface having a lower height.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A semiconductor package, comprising:
a package component having a non-planar surface; and
a plurality of conductive features formed on the non-planar surface of the package component;
wherein the conductive features comprise a first conductive feature and a second conductive feature respectively arranged in a first position and a second position of the non-planar surface, and wherein a height of the first position is less than a height of the second position, and a size of the first conductive feature is smaller than a size of the second conductive feature.

2. The semiconductor package as claimed in claim 1, wherein the non-planar surface of the package component is concave, the first position is close to a center of the package component, and the second position is close to an edge of the package substrate.

3. The semiconductor package as claimed in claim 1, wherein the non-planar surface of the package component is convex, the first position is close to an edge of the package component, and the second position is close to a center of the package substrate.

4. The semiconductor package as claimed in claim 1, wherein the conductive features further comprise a third conductive feature arranged in a third position of the non-planar surface of the package component and between the first conductive feature and the second conductive feature, and wherein a height of the third position is less than the height of the second position but greater than the height of the first position, and a size of the third conductive feature is smaller than the size of the second conductive feature but larger than the size of the first conductive feature.

5. The semiconductor package as claimed in claim 1, wherein the second conductive feature has a second diameter that is about 10 to 50 percent greater than a first diameter of the first conductive feature.

6. The semiconductor package as claimed in claim 1, wherein each of the first conductive feature and the second conductive feature comprises a conductive pad.

7. The semiconductor package as claimed in claim 1, wherein each of the first conductive feature and the second conductive feature comprises an under bump metallization (UBM) layer over a conductive pad.

8. The semiconductor package as claimed in claim 7, wherein a recess is formed on at least one of the first conductive feature and the second conductive feature.

9. The semiconductor package as claimed in claim 7, wherein a protrusion is formed on at least one of the first conductive feature and the second conductive feature.

10. The semiconductor package as claimed in claim 1, further comprising a plurality of conductive connectors formed on the conductive features,
wherein the conductive connectors comprise a first conductive connector and a second conductive connector respectively formed on the first conductive feature and the second conductive feature, and a height of the first conductive connector is greater than a height of the second conductive connector.

11. The semiconductor package as claimed in claim 1, wherein the package component is a semiconductor chip, an interposer, or a package substrate.

12. A semiconductor package, comprising:
a package component having a non-planar surface;
a plurality of conductive features on the non-planar surface of the package component, wherein the conductive features are arranged in different positions of the non-coplanar surface with different heights; and
a plurality of conductive connectors formed on the conductive features, wherein the conductive connectors have different heights, and wherein taller conductive connectors of the plurality of conductive connectors are formed on the conductive features arranged in lower positions of the non-coplanar surface, and shorter conductive connectors of the plurality of conductive connectors are formed on the conductive features arranged in higher positions of the non-coplanar surface.

13. The semiconductor package as claimed in claim 12, wherein the conductive features have different areas, and wherein the conductive features arranged in the lower positions of the non-coplanar surface has a first area, and the conductive features arranged in the higher positions of the non-coplanar surface has a second area which is greater than the first area.

14. The semiconductor package as claimed in claim 12, wherein the conductive features are formed in an array of orthogonal rows and columns, and wherein peripherally disposed conductive features of the plurality of conductive features have a greater area than centrally disposed conductive features of the plurality of conductive features so that peripherally disposed conductive connectors of the plurality of conductive connectors have a lower height than centrally disposed conductive connectors of the plurality of conductive connectors.

15. The semiconductor package as claimed in claim 14, wherein the non-planar surface of the package component is concave.

16. The semiconductor package as claimed in claim 12, wherein the conductive connectors have two or more different heights.

17. The semiconductor package as claimed in claim 12, wherein the conductive connectors are solder balls, and each of the solder balls has essentially the same amount of solder material.

18. A semiconductor package, comprising:
a package component having a non-planar surface, wherein the non-planar surface has a first region and a second region with different heights; and
a plurality of conductive features on the non-planar surface;
wherein the conductive features have different areas, and wherein larger-sized conductive features of the plurality of conductive features are arranged in the first region of the non-planar surface having a greater height, and smaller-sized conductive features of the plurality of conductive features are arranged in the second region of the non-planar surface having a lower height.

19. The semiconductor package as claimed in claim 18, wherein the non-planar surface of the package component is concave, and wherein the second region is a central region of the non-planar surface, and the first region is a peripheral region of the non-planar surface and surrounds the central region.

20. The semiconductor package as claimed in claim 18, wherein the non-planar surface of the package component is convex, and wherein the first region is a central region of the non-planar surface, and the second region is a peripheral region of the non-planar surface and surrounds the central region.

* * * * *